United States Patent [19]

Robertson

[11] Patent Number: 5,666,312

[45] Date of Patent: Sep. 9, 1997

[54] COLUMN REDUNDANCY SCHEME FOR A RANDOM ACCESS MEMORY INCORPORATING MULTIPLEXERS AND DEMULTIPLEXERS FOR REPLACING DEFECTIVE COLUMNS IN ANY MEMORY ARRAY

[75] Inventor: Peter D. Robertson, Fremont, Calif.

[73] Assignees: Sony Corporation of Japan; Sony Electronics, Inc., Park Ridge, N.J.

[21] Appl. No.: 648,539

[22] Filed: May 14, 1996

Related U.S. Application Data

[63] Continuation of Ser. No. 344,229, Nov. 23, 1994, abandoned.

[51] Int. Cl.[6] .................................................. G11C 7/00
[52] U.S. Cl. ............... 365/189.02; 365/200; 365/225.7; 365/230.03; 371/10.2; 371/10.3
[58] Field of Search .................. 365/189.02, 200, 365/225.7, 230.02, 230.03; 371/10.2, 10.3

[56] References Cited

U.S. PATENT DOCUMENTS

| | | | |
|---|---|---|---|
| 4,471,472 | 9/1984 | Young | 365/200 |
| 4,601,019 | 7/1986 | Shah et al. | 365/200 |
| 5,260,902 | 11/1993 | Pilling et al. | 365/189.02 |
| 5,287,310 | 2/1994 | Schreck et al. | 365/189.05 |
| 5,295,101 | 3/1994 | Stephens, Jr. et al. | 365/200 |
| 5,301,153 | 4/1994 | Johnson | 365/200 |

*Primary Examiner*—David C. Nelms
*Assistant Examiner*—Andrew Q. Tran
*Attorney, Agent, or Firm*—Irell & Manella LLP

[57] ABSTRACT

The present invention relates to methods and apparatus for mapping spare columns to defective columns in a fabricated random access memory (RAM). The defective columns correspond to improperly fabricated bit lines in the RAM and spare columns are fabricated on the RAM to replace any defective columns. Particular arrays of columns in the RAM are accessed through a corresponding input/output device. A defective column in an array is bypassed by a column redundancy scheme that allows a spare column to be mapped to more than one array of columns. Thus, a plurality of spare columns may be mapped to each array of columns. Since the total number of spare columns may be less than the total number of column arrays, the present invention provides a saving over the prior art which requires one spare column for each column array.

9 Claims, 2 Drawing Sheets

COLUMN REDUNDANCY SCHEME FOR A RANDOM ACCESS MEMORY INCORPORATING MULTIPLEXERS AND DEMULTIPLEXERS FOR REPLACING DEFECTIVE COLUMNS IN ANY MEMORY ARRAY this is a continuation of application Ser. No. 08/344,229, filed Nov. 23, 1994, now abandoned.

BACKGROUND OF THE INVENTION

1. Field of the Invention

This invention relates to integrated circuit memories and, more specifically, to a random access memory (RAM) with spare bit lines for use in place of defective bit lines.

2. Art Background

Random access memories (RAM) are common devices used in computers and many other modern digital systems. When a monolithic RAM is fabricated, errors in the fabrication process may render elements of the RAM defective. To avoid accessing the defective elements of the RAM, the defective elements are determined by testing and are then bypassed. The RAM is tested by writing and reading test data to all of the memory cells in the RAM. The memory cells in a RAM are accessed by row and column, where a column corresponds to the bit lines across a particular cell and a row corresponds to the word line of a cell. RAM memories typically divide the columns into separate arrays, and each array has a corresponding input/output driver. Frequently, it is sufficient to test only the columns in a RAM to determine whether a particular memory cell may be properly accessed. The defective columns are bypassed to insure integrity of the RAM.

Typically, in the prior art, defective columns are bypassed by a corresponding spare column fabricated on the RAM. When a RAM chip is fabricated, a spare column is fabricated for each array of columns on the chip. If one of the columns in a particular array is defective, the defective column is bypassed and the spare column is mapped to the corresponding input/output driver. Thus, there is typically one spare column for each input/output driver. The technique of bypassing defective columns with spare columns is known as column redundancy.

Fabricating one spare column for each input/output driver significantly increases the size of the fabricated chip where there are a relatively large number of column arrays. Modern fabrication techniques are such that most of the column arrays contain no defective columns, and thus the associated spare column for such arrays occupies space on the wafer and serves no purpose. Since miniaturization is an important goal in chip fabrication, a more efficient column redundancy scheme is desirable.

The present invention provides a more efficient column redundancy scheme by enabling a particular column to be mapped to more than one array of columns, thus decreasing the required number of spare columns and reducing the size of the chip.

SUMMARY OF THE INVENTION

The present invention implements a column redundancy scheme for a random access memory (RAM) by allowing a spare column to be mapped to more than one array of columns. A plurality of spare columns are provided to each array of columns. If a particular array of columns has a defective column, one of the spare columns replaces the defective columns through a multiplexer and a fuse matrix. Once a spare column is mapped to a particular array, that spare column cannot be used for a different array. Thus, if a different array of columns contains a defective column, a different spare column is mapped to replace the defective column. The number of spare columns fabricated on the RAM is less than the total number of column arrays. Thus, the present invention provides a savings over the prior art which requires one spare column for each column array. For read operations, the present invention maps a spare column to an output buffer through a multiplexer coupled to the plurality of spare columns and a data line from a particular array of columns. The multiplexer is further coupled to a fuse matrix that is programmed with the address of a defective column in that particular array. In response to an attempted read operation from this defective column, the fuse matrix input to the multiplexer selects one of the spare columns instead of the defective column. Write operations are similar, with a demultiplexer used instead of a multiplexer. In this manner, defective columns are bypassed by a corresponding spare column without dedicating a spare column to each array of columns.

DETAILED DESCRIPTION OF THE INVENTION

The present invention discloses methods and apparatus having particular application for providing a random access memory (RAM) with an efficient column redundancy scheme. Although the present invention is described with reference to specific circuits, block diagrams, and signals, etc., it will be appreciated by one of ordinary skill in the art that such details are disclosed simply to provide a more thorough understanding of the present invention. It will therefore be apparent to one skilled in the art that the present invention may be practiced without these specific details. In other instances, well known circuits are shown in block diagram form in order not to obscure the present invention unnecessarily.

Figure 1:
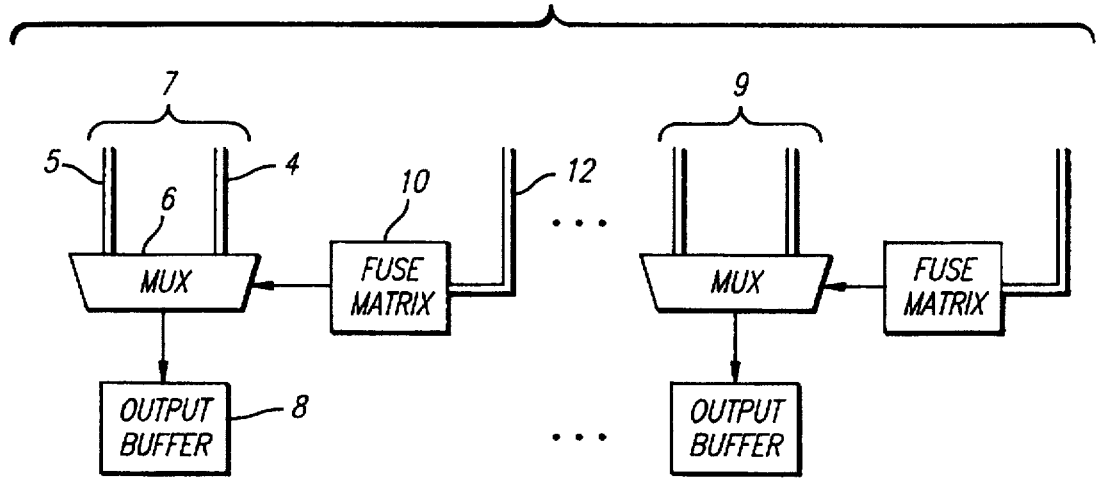
FIG. 1 is an illustration of a prior art column redundancy scheme for bypassing defective columns with spare columns.

FIG. 1 is a block diagram of a prior art column redundancy scheme for a RAM (not shown). The RAM contains a plurality of columns separated into arrays, including arrays 7 and 9. The column array 7 includes columns 4 and 5. A column in the column array 7 selected for reading or writing is provided to an output buffer 8 through a multiplexer 6. A spare column 12 is coupled to a fuse matrix 10 and, if one of the columns in the column array 7 is defective, the fuse matrix 10 is programmed with the address of the defective column. The fuse matrix 10 is coupled to the multiplexer 6 and provides an input to the multiplexer 6 to select the spare column 12 when a read on the defective column address is attempted. Thus, a defective column is effectively replaced by the spare column 12 through the fuse matrix 10 and the multiplexer 6 such that the spare column is accessed through the output buffer 8 rather than the defective column. The circuit illustrated in FIG. 1 is identical for each array of columns in the RAM, including column array 9. The write circuitry is similar, with a demultiplexer in place of a multiplexer. Thus, according to the prior art column redundancy scheme as illustrated in FIG. 1, one spare column is dedicated to a particular array of columns, 7 or 9.

Figure 2:
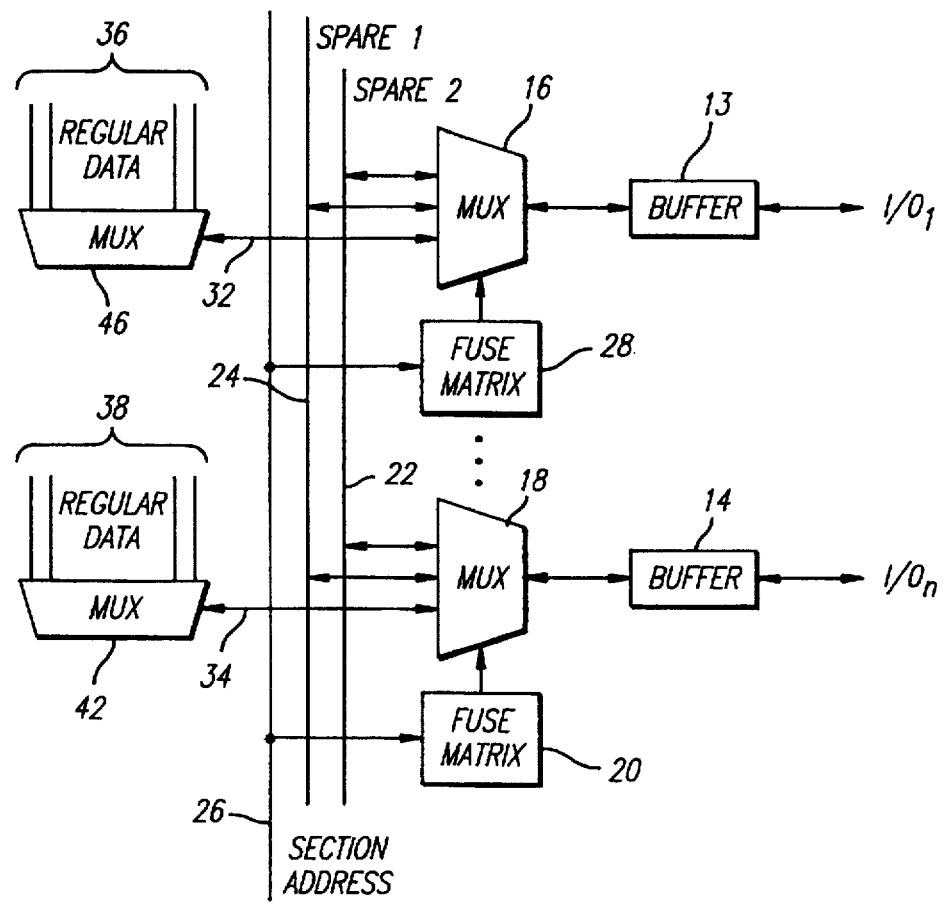
FIG. 2 is a block diagram of the column redundancy scheme of the present invention for a read operation.

FIG. 2 illustrates the column redundancy scheme of the present invention for read operations. As shown in the figure, each of a plurality of spare column lines, 22 and 24, is coupled to a plurality of multiplexers, including multiplexers 16 and 18. The multiplexer 16 is coupled to a line 32 that is selected by a multiplexer 46 from an array of columns 36. Similarly, the multiplexer 18 is coupled to a line 34 that is selected by a multiplexer 42 from an array of columns 38. The multiplexers 16 and 18 are coupled to read buffers 13 and 14, respectively. If one of the columns in the array 36 is defective, that column is bypassed by the spare column 22 or 24 through a fuse matrix 28 and the multiplexer 16. The fuse matrix 28 is programmed with the address of the defective column and selects a spare column when the accessed column is a defective column. The address of the accessed column is provided to the fuse matrix 28 over line 26.

When a particular spare column is dedicated to a particular multiplexer, that spare column is no longer available as a spare for other multiplexers, which must be provided with spare columns that have not been mapped to another array of columns. According to the configuration of FIG. 2, spare columns may substitute for a defective column in any of a number of column arrays. For example, the spare column 24 may be mapped to a defective column in arrays 36 or 38. Thus, a spare column is not dedicated to those arrays that do not have a defective column, which results in a reduction in the number of spare columns that need to be fabricated on a chip. Chip size is correspondingly reduced.

Figure 3:
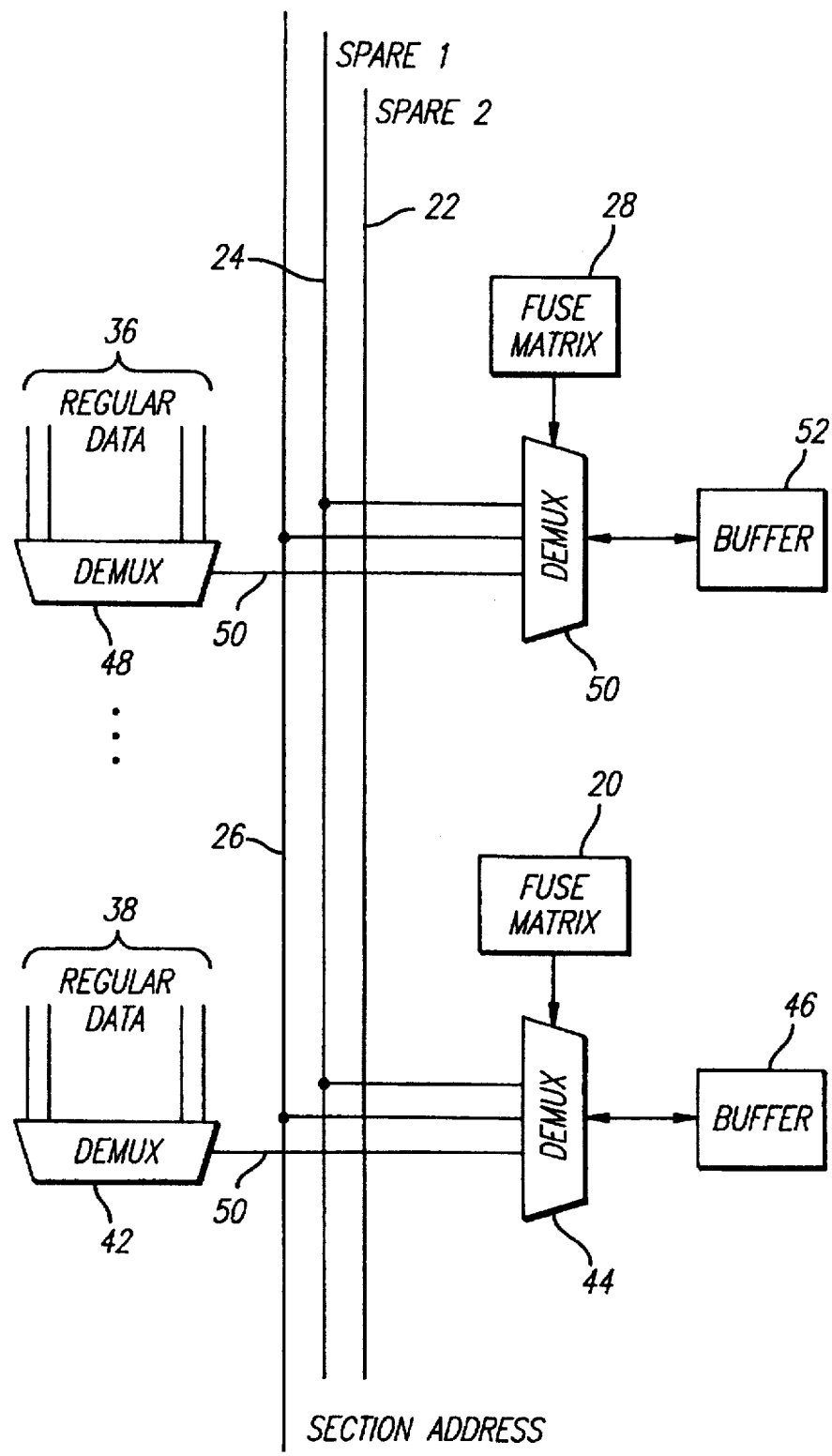
FIG. 3 is a block diagram of the column redundancy scheme of the present invention for a write operation.

FIG. 3 illustrates the column redundancy scheme of the present invention for write operations. As illustrated in the figure, a demultiplexer 44 is coupled to the fuse matrix 20 and a write buffer 46. Data from the write buffer 46 is provided to the demultiplexer 44 which selects between the spare column 24, the spare column 22 and a data column 50. As described with regard to FIG. 2, if a column in the array 38 is defective, the fuse matrix 20 is programmed with the address of the defective column. When a write on the defective column is attempted, the demultiplexer 44 selects the spare column 22 or the spare column 24 instead of the defective column. Conversely, if the selected column is not defective, the demultiplexer 44 selects the data line 50 and a demultiplexer 42 then selects the appropriate column in the column array 38. The operation of write buffer 52, demultiplexer 51, fuse matrix 28, data line 50 and demultiplexer 48 is identical for column array 36.

While the invention has been described in conjunction with the preferred embodiment, it is evident that numerous alternatives, modifications, variations and uses will be apparent to those skilled in the art in light of the foregoing description. For example, more than two spare columns may be mapped to each array of columns. Further, a circuit element other than a fuse matrix in conjunction with a multiplexer may select a spare column to bypass a defective column. It is also possible to arrange the arrays of columns into groups and dedicate one spare column for the group. If one column in one of the arrays in the group is defective, the defective column is bypassed by the one spare column. Many other adaptations of the present invention are possible.

I claim:

1. An integrated circuit random access memory (RAM) comprising:

a plurality of arrays of columns;

at least two spare columns for replacing defective columns;

a plurality of first multiplexers, each first multiplexer corresponding to a different one of each of said plurality of arrays of columns, each first multiplexer having as inputs at least one column from a corresponding one of the plurality of arrays of columns and said at least two spare columns;

a column address line for a column address signal, and a plurality of programmable elements, each such programmable dement associated with only one of said plurality of first multiplexers, each programmable dement having as an input the column address signal and as an output line a selector input to each said programmable dement's corresponding one of the plurality of first multiplexers, each programmable element being programmable to provide a selection signal over one of said selector inputs in response to the column address signal to address one of said at least one column or either of said at least two spare columns that are input to one of the first multiplexers.

2. The RAM of claim 1 further comprising a plurality of second multiplexers, each second multiplexer corresponding to a different one of each of said plurality of arrays of columns, each second multiplexer having as inputs each column in a corresponding one of the arrays of columns and having as an output said at least one column from said corresponding one of the plurality of arrays of columns.

3. The memory of claim 1 wherein said programmable elements comprise fuse matrices.

4. The RAM of claim 1 further comprising:

a plurality of first demultiplexers, each first demultiplexer corresponding to a different one of each of said plurality of arrays of columns, each first demultiplexer having as outputs to at least one column from a corresponding one of the plurality of arrays of columns and said at least two spare columns, wherein each programmable element is associated with only one of said plurality of first demultiplexers, each programmable element having as an input the column address signal and as an output line a selector input to each said programmable element's corresponding one of the plurality of first demultiplexers, each programmable element being programmable to provide a selection signal over one of said selector inputs in response to the column address signal to address one of said at least one column or either of said at least two spare columns that are output of one of the first demultiplexers.

5. The RAM of claim 4 further comprising a plurality of second demultiplexers, each second demultiplexer corresponding to a different one of each of said plurality of arrays of columns, each second demultiplexer having as outputs each column in a corresponding one of the arrays of columns.

6. The RAM of claim 4 wherein said programmable elements comprise fuse matrices.

7. An integrated circuit random access memory (RAM) comprising:

a plurality of arrays of columns;

at least two spare columns for replacing defective columns;

a plurality of first demultiplexers, each first demultiplexer corresponding to a different one of each of said plurality of arrays of columns, each first demultiplexer having as outputs to at least one column from a corresponding one of the plurality of arrays of columns and said at least two spare columns;

a column address line for a column address signal; and a plurality of programmable elements, each such programmable element associated with only one of said plurality of first demultiplexers, each programmable element having as an input the column address signal and as an output line a selector input to each said programmable element's corresponding one of the plurality of first demultiplexers, each programmable element being programmable to provide a selection signal over one of said selector inputs in response to the column address signal to address one of said at least one column or either of said at least two spare columns that are output of one of the first demultiplexers.

8. The RAM of claim 7 further comprising a plurality of second demultiplexers, each second demultiplexer corresponding to a different one of each of said plurality of arrays of columns, each second demultiplexer having as outputs each column in a corresponding one of the arrays of columns.

9. The RAM of claim 7 wherein said programmable elements comprise fuse matrices.

* * * * *

UNITED STATES PATENT AND TRADEMARK OFFICE
CERTIFICATE OF CORRECTION

PATENT NO. : 5,666,312
DATED : September 9, 1997
INVENTOR(S) : Peter D. Robertson It is certified that error appears in the above-identified patent and that said Letters Patent is hereby corrected as shown below:

In column 4 at lines 12 and 14 delete "dement" and insert --element--

In column 4 at line 16 delete "dement's" and insert --element's--

Signed and Sealed this

Second Day of November, 1999

*Attest:*

Q. TODD DICKINSON

*Attesting Officer*  Acting Commissioner of Patents and Trademarks